(12) United States Patent
Chen et al.

(10) Patent No.: US 12,283,950 B2
(45) Date of Patent: Apr. 22, 2025

(54) COMMON-MODE TRANSIENT SUPPRESSION PROTECTION CIRCUIT FOR DIGITAL ISOLATOR

(71) Applicant: SUZHOU NOVOSENSE MICROELECTRONICS CO., LTD., Suzhou (CN)

(72) Inventors: Qihui Chen, Suzhou (CN); Yun Sheng, Suzhou (CN)

(73) Assignee: SUZHOU NOVOSENSE MICROELECTRONICS CO., LTD., Suzhou (CN)

(*) Notice: Subject to any disclaimer, the term of this patent is extended or adjusted under 35 U.S.C. 154(b) by 249 days.

(21) Appl. No.: 17/926,617

(22) PCT Filed: Oct. 23, 2020

(86) PCT No.: PCT/CN2020/123298
§ 371 (c)(1),
(2) Date: Nov. 20, 2022

(87) PCT Pub. No.: WO2021/232672
PCT Pub. Date: Nov. 25, 2021

(65) Prior Publication Data
US 2023/0188136 A1 Jun. 15, 2023

(30) Foreign Application Priority Data
May 20, 2020 (CN) .......................... 202010431409.4

(51) Int. Cl.
*H04L 27/04* (2006.01)
*G05F 1/56* (2006.01)
(Continued)

(52) U.S. Cl.
CPC ......... *H03K 19/00315* (2013.01); *G05F 1/56* (2013.01); *H04L 25/0268* (2013.01); *H03K 19/20* (2013.01)

(58) Field of Classification Search
CPC .... G05F 1/56; H03K 19/00315; H03K 19/20; H04L 25/0268
See application file for complete search history.

(56) References Cited

U.S. PATENT DOCUMENTS 10,659,173 B1* 5/2020 Li ............................ H04B 1/40
2014/0078630 A1 3/2014 Koch et al.
(Continued)

FOREIGN PATENT DOCUMENTS

CN    101118450 A    2/2008
CN    101877683 A    11/2010
(Continued)

OTHER PUBLICATIONS

Mallia S. et al., "A Self-Powered 50-Mb/s OOK Transmitter for Optoisolator LED Emulation," IEEE Journal of Solid-State Circuits, vol. 52, No. 3, Mar. 2017, pp. 678-687.

*Primary Examiner* — Kurtis R Bahr
(74) *Attorney, Agent, or Firm* — Birch, Stewart, Kolasch & Birch, LLP

(57) ABSTRACT

The present invention provides a common-mode transient suppression protection circuit for a digital isolator, including a modulation circuit, a demodulation circuit and an isolation capacitor connected between the modulation circuit and the demodulation circuit. The modulation circuit includes a modulation circuit front-end and a drive circuit, which are connected in sequence, and a clamping module is arranged in the drive circuit. The protection circuit further includes a linear voltage regulator structure connected with the drive circuit, and a power supply clamp is arranged in the linear voltage regulator structure. By providing the linear voltage
(Continued)

regulator structure having the power supply clamp and the drive circuit having the clamping module in the protection circuit, low-voltage devices in the drive circuit can be protected from being damaged by high-voltage signals generated by common-mode transient interference.

10 Claims, 2 Drawing Sheets

(51) Int. Cl.
*H03K 19/003* (2006.01)
*H04L 25/02* (2006.01)
*H03K 19/20* (2006.01)

(56) References Cited

U.S. PATENT DOCUMENTS

| | | | |
|---|---|---|---|
| 2017/0201399 A1* | 7/2017 | Adinarayana | H04B 1/0475 |
| 2018/0294945 A1* | 10/2018 | Ng | H04L 25/0266 |

FOREIGN PATENT DOCUMENTS

| | | | |
|---|---|---|---|
| CN | 103887965 A | 6/2014 | |
| CN | 104317760 A | 1/2015 | |
| CN | 204166525 U | 2/2015 | |
| CN | 105629815 A | 6/2016 | |
| CN | 105790754 A | 7/2016 | |
| CN | 106961272 A | 7/2017 | |
| CN | 107919861 A | 4/2018 | |
| CN | 108988831 A | 12/2018 | |
| CN | 208836102 U | 5/2019 | |
| CN | 210270587 U | 4/2020 | |
| CN | 111490773 A | 8/2020 | |

* cited by examiner

COMMON-MODE TRANSIENT SUPPRESSION PROTECTION CIRCUIT FOR DIGITAL ISOLATOR

CROSS-REFERENCE TO RELATED APPLICATION

This application is a 35 U.S.C. § 371 National Phase conversion of International (PCT) Patent Application No. PCT/CN2020/123298, filed on Oct. 23, 2020, which claims priority to Chinese Patent Application No. 202010431409.4, filed on May 20, 2020 and entitled "COMMON-MODE TRANSIENT SUPPRESSION PROTECTION CIRCUIT FOR DIGITAL ISOLATOR", the disclosure of which is here incorporated by reference in its entirety. The PCT International Patent Application was filed and published in Chinese.

TECHNICAL FIELD

The present invention relates to the field of chips for digital isolators, and in particular, relates to a common-mode transient suppression protection circuit for a digital isolator.

BACKGROUND

In the prior art, a data input is input to a modulation circuit, a demodulation circuit is connected to a data output, and the modulation circuit and the demodulation circuit are isolated via an isolation capacitor. Moreover, the modulation circuit is connected to a reference ground GND1, and the demodulation circuit is connected to a reference ground GND2, such that the reference ground GND1 and the reference ground GND2 can be isolated from each other via the isolation capacitor.

However, a drive circuit in the modulation circuit generally consists of high-speed low-voltage devices. Therefore, when common-mode transient interference occurs, the low-voltage devices are susceptible to damages caused by high-voltage signals generated from interference signals.

Therefore, there is a need for the design of a new common-mode transient suppression protection circuit capable of reducing the influence of common-mode transient interference signals.

SUMMARY

To solve one of the above problems, the present invention provides a common-mode transient suppression protection circuit for a digital isolator, comprising a modulation circuit, a demodulation circuit, and an isolation capacitor connected between the modulation circuit and the demodulation circuit; wherein the modulation circuit comprises a modulation circuit front-end and a drive circuit, which are connected in sequence, a clamping module being arranged in the drive circuit; and the protection circuit further comprises a linear voltage regulator structure connected to the drive circuit, a power supply clamp being arranged in the linear voltage regulator structure.

As a further improvement of the present invention, the linear voltage regulator structure further comprises a linear voltage regulator and a voltage regulation follower, wherein the linear voltage regulator is connected to an external reference voltage, the voltage regulation follower and the power supply clamp are both connected to the linear voltage regulator, and the power supply clamp is connected to the drive circuit and provides an output voltage TX_VDD.

As a further improvement of the present invention, the linear voltage regulator comprises an amplifier, an NMOS transistor MD1, a PMOS transistor MD3, a resistor RD1 and a resistor RD2, wherein a positive input terminal of the amplifier is connected to the external reference voltage, an output terminal of the amplifier is connected to a gate of the NMOS transistor MD1, and a drain of the NMOS transistor MD1 is connected to an external power supply; a negative input terminal of the amplifier is grounded via the resistor RD2, and is connected to a source of the PMOS transistor MD3 via the resistor RD1; and a gate and a drain of the PMOS transistor MD3 are connected, and a source of the NMOS transistor MD1 is also connected to the source of the PMOS transistor MD3.

As a further improvement of the present invention, the voltage regulation follower comprises an NMOS transistor MD2, which has a drain connected to the external power supply, a gate connected to the output terminal of the amplifier, and a source connected to the power supply clamp and the output voltage TX_VDD.

As a further improvement of the present invention, the power supply clamp comprises a PMOS transistor MD4, an NMOS transistor MD6 and an NMOS transistor MD7, wherein a gate of the PMOS transistor MD4 and a gate of the PMOS transistor MD3 are connected to each other, and a source of the PMOS transistor MD4 is connected to the output voltage TX_VDD and the source of the NMOS transistor MD2; and a gate of the NMOS transistor MD6 and a gate of the NMOS transistor MD7 are connected to each other and form a current mirror, a drain and a gate of the NMOS transistor MD6 are connected to each other and connected to a drain of the PMOS transistor MD4, and a source of the NMOS transistor MD6 and a source of the NMOS transistor MD7 are grounded.

As a further improvement of the present invention, at least one output voltage TX_VDD is provided, and each output voltage TX_VDD is complementarily equipped with one power supply clamp and one voltage regulation follower; and when at least two output voltages TX_VDD are provided, the at least two output voltages TX_VDD can share one linear voltage regulator.

As a further improvement of the present invention, the drive circuit further comprises a drive module electrically connected to the modulation circuit front-end and the linear voltage regulator, and a functional module electrically connected to the drive module, the clamping module being electrically connected to the functional module.

As a further improvement of the present invention, two drive modules, two functional modules, and two clamping modules are respectively provided and symmetrically arranged.

As a further improvement of the present invention, the functional module comprises a PMOS transistor M9 and a PMOS transistor M19, which are symmetrically arranged and are strong in drive capability, a gate of the PMOS transistor M9 and a gate of the PMOS transistor M19 being connected to the two drive modules, respectively, and the PMOS transistor M9 and the PMOS transistor M19 each having a drain grounded and a source connected to the output voltage TX_VDD; and the drive module further comprises a PMOS transistor M7 and a PMOS transistor M17, which are symmetrically arranged and are weak in drive capability, the PMOS transistor M7 and the PMOS transistor M17 having gates also connected to the two drive modules respectively, and having sources connected to the output voltage TX_VDD.

As a further improvement of the present invention, the functional module further comprises a PMOS transistor M1 and a PMOS transistor M11, which are symmetrically arranged, wherein the PMOS transistor M1 and the PMOS transistor M11 have sources both connected to the output voltage TX_VDD, having gates connected to the drain of the PMOS transistor M7 and the drain of the PMOS transistor M17 respectively, and having drains connected to output voltages TX_DRVP and TX_DRVN respectively, and the output voltages TX_DRVP and TX_DRVN are both connected to the isolation capacitor; and the functional module further comprises an NMOS transistor M2 and an NMOS transistor M12, which are symmetrically arranged, wherein the NMOS transistor M2 and the NMOS transistor M12 have drains connected to the drain of the PMOS transistor M1 and the drain of the PMOS transistor M11 respectively, and have gates connected to the gate of the PMOS transistor M1 and the gate of the PMOS transistor M11 respectively, and the gates and sources of the NMOS transistor M2 and the NMOS transistor M12 are connected to two embedded modules respectively.

As a further improvement of the present invention, the clamping module comprises a PMOS transistor M4, a PMOS transistor M5 and an NMOS transistor M6, as well as a PMOS transistor M14, a PMOS transistor M15, and an NMOS transistor M16, which are all symmetrically arranged, wherein the PMOS transistor M4 has a source connected to the gate of the NMOS transistor M2, and has a drain and a gate which are connected with each other and connected to a source of the PMOS transistor M5, the PMOS transistor M5 has a gate and a drain which are connected with each other and connected to a drain of the NMOS transistor M6, and a source of the NMOS transistor M6 is connected to the source of the NMOS transistor M2; and the PMOS transistor M14 has a source connected to the gate of the NMOS transistor M12, and has a drain and a gate which are connected with each other and connected to a source of the PMOS transistor M15, the PMOS transistor M15 has a gate and a drain which are connected with each other and connected to a drain of the NMOS transistor M16, and a source of the NMOS transistor M16 is connected to the source of the NMOS transistor M12.

Compared with the prior art, the present invention provides a common-mode transient suppression protection circuit for a digital isolator, where a linear voltage regulator structure having a power supply clamp and a drive circuit having a clamping module are arranged in the protection circuit, such that low-voltage devices in the drive circuit can be protected from being damaged by high-voltage signals generated by common-mode transient interference.

DETAILED DESCRIPTION

In order to allow those skilled in the art to have a better understanding of the technical solutions in the present disclosure, the technical solutions in the embodiments of the present invention will be described clearly and completely below in conjunction with the accompanying drawings in the embodiments of the present invention. Obviously, the embodiments described are merely some instead of all of the embodiments of the present invention. Based on the embodiments in the present invention, every other embodiment obtained by those of ordinary skills in the art without creative labor shall fall within the protection scope of the present invention.

Figure 1:
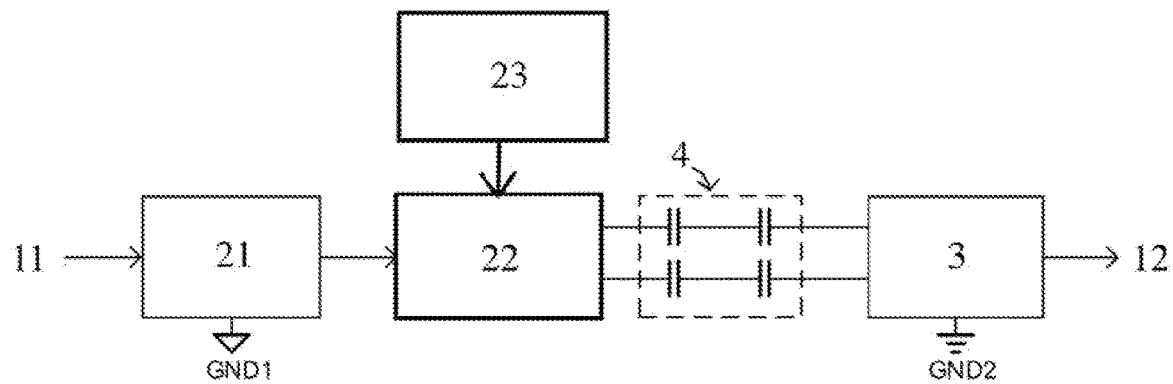
FIG. 1 shows a schematic diagram of a circuit structure of a protection circuit according to the present invention.
Figure 2:
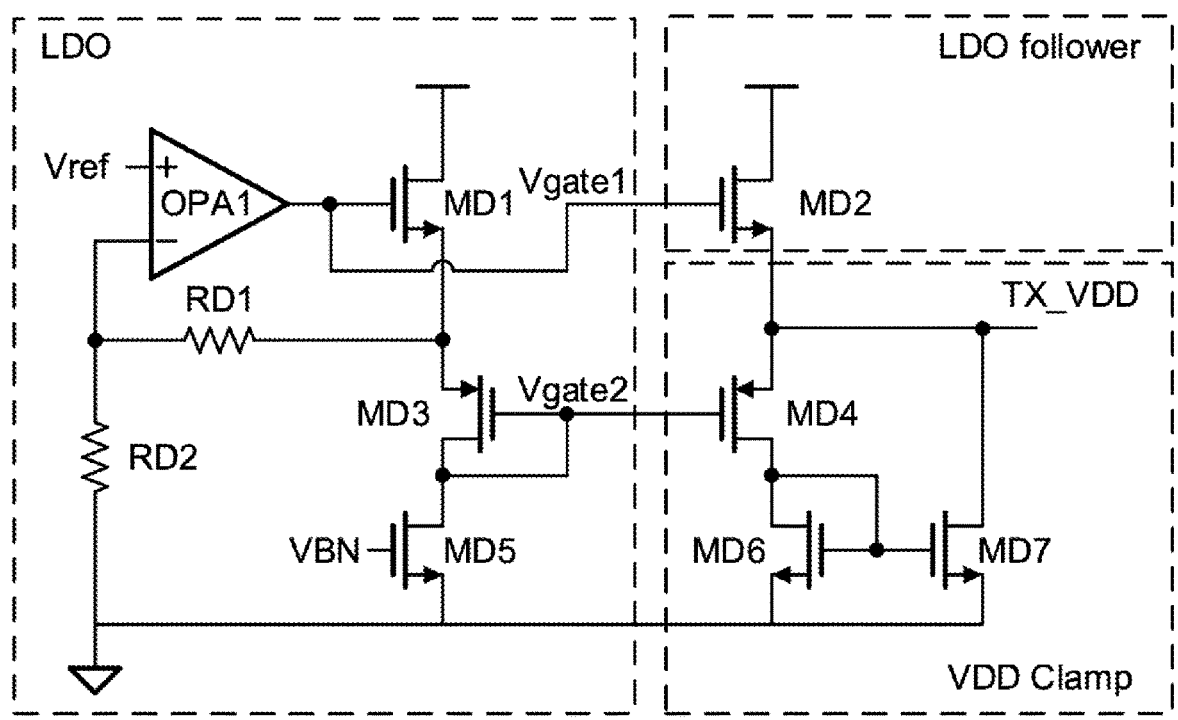
FIG. 2 shows a schematic diagram of a circuit structure of a linear voltage regulator structure according to the present invention.
Figure 3:
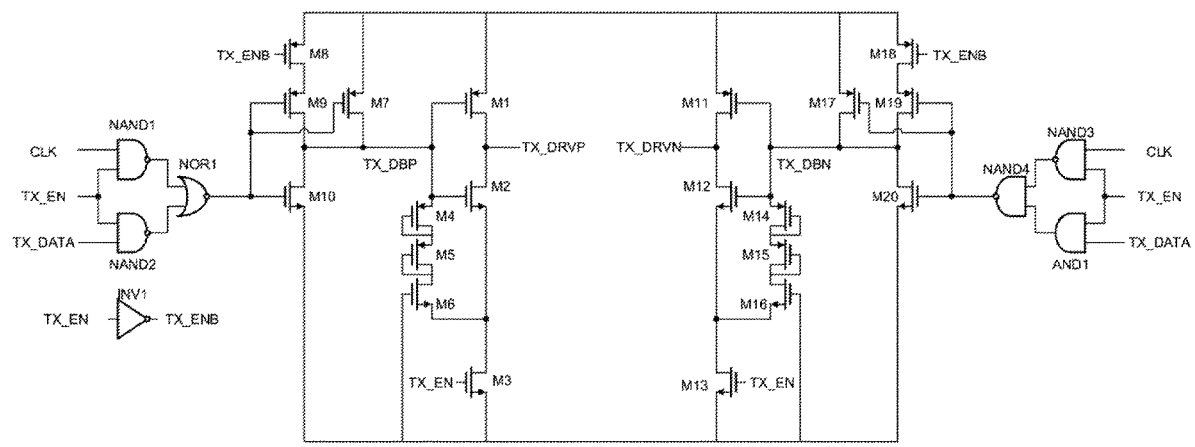
FIG. 3 shows a schematic diagram of a circuit structure of a drive circuit according to the present invention.

As shown in FIG. 1 to FIG. 3, the present invention provides a common-mode transient suppression protection circuit for a digital isolator, including a modulation circuit, a demodulation circuit 3 and an isolation capacitor 4 connected between the modulation circuit and the demodulation circuit 3. A data input 11 is input to the modulation circuit, and the demodulation circuit 3 is configured to output a data output 12. Moreover, the modulation circuit and the demodulation circuit 3 are respectively connected to a reference ground GND1 and a reference ground GND2, and the reference ground GND1 and the reference ground GND2 are isolated from each other via the isolation capacitor 4.

The modulation circuit includes a modulation circuit front-end 21 and a drive circuit 22, which are connected in sequence, whereby the data input 11 is connected to the modulation circuit front-end 21, the drive circuit 22 is connected to the isolation capacitor 4, and the reference ground GND1 is connected to the modulation circuit front-end 21. A clamping module is arranged in the drive circuit 22. The protection circuit further includes a linear voltage regulator structure 23 connected to the drive circuit 22, and a power supply clamp VDD Clamp is arranged in the linear voltage regulator structure 23.

The clamping module is arranged in the drive circuit 22, such that the drive circuit 22 has a clamping function, which can protect low-voltage devices in the drive circuit 22 and prevent the low-voltage devices from being damaged by high-voltage signals generated from common-mode transient interference signals. In another aspect, the linear voltage regulator structure 23 is configured to provide an output voltage TX_VDD to the drive circuit 22, and the linear voltage regulator structure 23 is also provided with a power supply clamp VDD Clamp, which also has a clamping function and can further protect the low-voltage devices in the drive circuit 22.

Further, as shown in FIG. 2, the linear voltage regulator structure 23 further includes a linear voltage regulator LDO and a voltage regulation follower LDO follower. The linear voltage regulator LDO, the voltage regulation follower LDO follower and the power supply clamp VDD Clamp are electrically connected to each other to form the linear voltage regulator structure 23 having the clamping function. The linear voltage regulator LDO is connected to an external reference voltage Vref to generate a voltage, the voltage regulator follower LDO follower and the power supply clamp VDD Clamp are both connected to the linear voltage regulator LDO, and the power supply clamp VDD Clamp is connected to the drive circuit 22 and provides the output voltage TX_VDD.

The power supply clamp VDD Clamp is configured to clamp the output voltage TX_VDD, so as to prevent the output voltage TX_VDD from damaging the low-voltage devices in the drive circuit 22 due to a large fluctuation of the output voltage TX_VDD caused by the common-mode transient interference signal.

The linear voltage regulator LDO includes an amplifier OPA1, an NMOS transistor MD1, a PMOS transistor MD3, a resistor RD1 and a resistor RD2. A positive input terminal of the amplifier OPA1 is connected to the external reference voltage Vref, and an output terminal of the amplifier OPA1 is connected to a gate of the NMOS transistor MD1; and a drain of the NMOS transistor MD1 is connected to an external power supply. A negative input terminal of the amplifier OPA1 is grounded via the resistor RD2, and is connected to a source of the PMOS transistor MD3 via the resistor RD1. A gate and a drain of the PMOS transistor MD3 are connected, and a source of the NMOS transistor MD1 is also connected to the source of the PMOS transistor MD3.

In conjunction with FIG. 2, the positive input terminal of the amplifier OPA1 is connected to the reference voltage Vref, and cooperates with the resistor RD1 and the resistor RD2 to amplify the reference voltage Vref. Specifically, according to the principles of "virtual short circuit" and "virtual open circuit" of the amplifier OPA1, a voltage Vs at the source of the PMOS transistor MD3, i.e., the source of the NMOS transistor MD1, is:

$$Vs = \frac{RD1 + RD2}{RD2}.$$

Therefore, the proportional relation between the reference voltage Vref and the voltage Vs can be adjusted according to the proportional relation between the resistor RD1 and the resistor RD2.

Then, when a common-mode transient interference signal occurs, the voltage Vs is pulled up accordingly. The PMOS transistor MD3 works in a saturated state due to the use of a diode connection method in which a gate and a drain are interconnected. Therefore, the PMOS transistor MD3 is equivalent to an active load, through which a voltage flowing is constant.

In fact, the linear voltage regulator LDO further includes an NMOS transistor MD5, which has a source grounded, a drain connected to the drain of the PMOS transistor MD3, and a gate connected to another external power supply VBN.

Further, the voltage regulation follower LDO follower includes an NMOS transistor MD2, which has a drain connected to the external power supply, a gate connected to the output terminal of the amplifier OPA1, and a source connected to the power supply clamp VDD Clamp and the output voltage TX_VDD.

Since the gate of the NMOS transistor MD2 is connected to the output terminal of the amplifier OPA1, the NMOS transistor MD2 and the NMOS transistor MD1 are mirrored. Then, the output voltage TX_VDD is in effect equal to the aforementioned voltage Vs, and the output voltage TX_VDD is also proportional to the reference voltage Vref as described above.

Then, specifically, the power supply clamp VDD Clamp includes a PMOS transistor MD4, an NMOS transistor MD6 and an NMOS transistor MD7. A gate of the PMOS transistor MD4 and a gate of the PMOS transistor MD3 are connected to each other, and a source of the PMOS transistor MD4 is connected to the output voltage TX_VDD and the source of the NMOS transistor MD2. A gate of the NMOS transistor MD6 and a gate of the NMOS transistor MD7 are connected to each other and form a current mirror; a drain and a gate of the NMOS transistor MD6 are connected to each other and connected to a drain of the PMOS transistor MD4; and a source of the NMOS transistor MD6 and a source of the NMOS transistor MD7 are grounded.

The gate of the PMOS transistor MD4 is connected to the gate of the PMOS transistor MD3. When the output voltage TX_VDD rises, the PMOS transistor MD4 is turned on. Since the NMOS transistor MD6 is subjected to a diode connection method in which the gate and the drain are interconnected, the NMOS transistor MD6 is equivalent to an active load, and a voltage drop across the NMOS transistor MD6 is constant, such that the clamping function is achieved. Moreover, the NMOS transistor MD6 and the NMOS transistor MD7 form a current mirror, which can thus absorb a current generated by the common-mode transient interference signal, such that the output voltage TX_VDD is prevented from rising too high in one step, i.e., being reduced in rising amplitude, and meanwhile, is prevented from affecting the low-voltage devices in the drive circuit 22.

In addition, at least one output voltage TX_VDD is provided, and each output voltage TX_VDD is complementarily equipped with one power supply clamp VDD Clamp and one voltage regulation follower LDO follower. When at least two output voltages TX_VDD are provided, the at least two output voltages TX_VDD can share one linear voltage regulator LDO. That is, in the present invention, a plurality of output voltages TX_VDD can share one linear voltage regulator LDO, and each output voltage TX_VDD can only be equipped with one power supply clamp VDD Clamp and one voltage regulator follower LDO follower.

Further, the drive circuit 22 further includes a drive module electrically connected to the modulation circuit front-end 21 and the linear voltage regulator LDO, and a functional module electrically connected to the drive module. The clamping module is electrically connected to the functional module.

The drive module is connected to the linear voltage regulator LDO and the modulation circuit front-end 21 to obtain the output voltage TX_VDD and other functional signals. Since the devices in the functional module are liable to breakdown when the voltage suddenly rises, the clamping module is required to clamp the voltage.

Specifically, in this embodiment, as shown in FIG. 3, two drive modules, two functional modules, and two clamping modules are provided and symmetrically arranged.

The drive module includes NAND gates NAND1 to NAND4, an NOR gate NOR1, and an AND gate AND1. The circuits of the above gates are symmetrically arranged, and are connected to a clock CLK signal, a TX_EN signal and a TX_DATA signal. The drive module further includes a NOT gate INV1, and the above TX_EN signal passes through the NOT gate INV1 to produce a TX_ENB signal, which is input to the driver circuit 22.

The functional module includes a PMOS transistor M9 and a PMOS transistor M19, which are symmetrically arranged and are strong in drive capability. A gate of the PMOS transistor M9 and a gate of the PMOS transistor M19 are connected to the two drive modules, respectively, and the PMOS transistor M9 and the PMOS transistor M19 each have a drain grounded and a source connected to the output voltage TX_VDD. The drive module further includes a PMOS transistor M7 and a PMOS transistor M17, which are symmetrically arranged and are weak in drive capability. The PMOS transistor M7 and the PMOS transistor M17 have gates also connected to the two drive modules respectively, and have sources connected to the output voltage TX_VDD. In the present invention, specifically, the functional module further includes a PMOS transistor M8 and a PMOS transistor M18, and the sources of the PMOS transistor M9 and the PMOS transistor M19 are not directly connected to the output voltage TX_VDD, but are connected to the output voltage TX_VDD via the PMOS transistor M8 and the PMOS transistor M18, and the gates of the PMOS transistor M8 and the PMOS transistor M18 are connected to the TX_ENB signal.

Since the PMOS transistor M7 and the PMOS transistor M17 are PMOS transistors with weak drive capability, the voltage TX_DBP at the drain of the PMOS transistor M7 and the voltage TX_DBN at the drain of the PMOS transistor M17 are easy to pull down. The PMOS transistor M9 and the PMOS transistor M19 are PMOS transistors with strong drive capability, and thus can drive subsequent components of the functional module.

The functional module further includes a PMOS transistor M1 and a PMOS transistor M11, which are symmetrically arranged. The PMOS transistor M1 and the PMOS transistor M11 have sources both connected to the output voltage TX_VDD, having gates connected to the drain of the PMOS transistor M7 and the drain of the PMOS transistor M17 respectively, and having drains connected to output voltages TX_DRVP and TX_DRVN respectively, and the output voltages TX_DRVP and TX_DRVN are both connected to the isolation capacitor.

The functional module further includes an NMOS transistor M2 and an NMOS transistor M12, which are symmetrically arranged. The NMOS transistor M2 and the NMOS transistor M12 have drains connected to the drain of the PMOS transistor M1 and the drain of the PMOS transistor M11 respectively, and have gates connected to the gate of the PMOS transistor M1 and the gate of the PMOS transistor M11 respectively, and the gates and sources of the NMOS transistor M2 and the NMOS transistor M12 are connected to two embedded modules respectively.

When the drive module is turned off, since the PMOS transistor M7 and the PMOS transistor M17 are turned on at a low level, the voltage TX_DBP at the drain of the PMOS transistor M7 and the voltage TX_DBN at the drain of the PMOS transistor M17 are at a high level; meanwhile, since the PMOS transistor M1 and the PMOS transistor M11 are also turned on at a low level, the PMOS transistor M1 and the PMOS transistor M11 are turned off. On the contrary, since the NMOS transistor M2 and the NMOS transistor M12 are turned on at a high level, the NMOS transistor M2 and the NMOS transistor M12 are turned on. Therefore, when a common-mode transient interference signal occurs, the output voltages TX_DRVP and TX_DRVN are pulled down, and may even be pulled to negative voltages. If the voltages TX_DBP and TX_DBN maintain a high level for a long time, the PMOS transistors M1 and M11 and the NMOS transistors M2 and M12 may be broken down due to an overvoltage between the gate and the drain. Therefore, the drive circuit 22 in the present invention is provided with two clamping modules, which are respectively connected to the gates and sources of the NMOS transistor M2 and M12. The clamping modules can clamp the voltages between the gates and the drains of the NMOS transistors M2 and M12, and can also clamp the voltages between the gates and the drains of the PMOS transistors M1 and M11.

Therefore, the clamping module includes a PMOS transistor M4, a PMOS transistor M5, and an NMOS transistor M6, as well as a PMOS transistor M14, a PMOS transistor M15, and an NMOS transistor M16, which are all symmetrically arranged. The PMOS transistor M4 has a source connected to the gate of the NMOS transistor M2, and has a drain and a gate which are connected with each other and connected to a source of the PMOS transistor M5; the PMOS transistor M5 has a gate and a drain which are connected with each other and connected to a drain of the NMOS transistor M6; and a source of the NMOS transistor M6 is connected to the source of the NMOS transistor M2. The PMOS transistor M14 has a source connected to the gate of the NMOS transistor M12, and has a drain and a gate which are connected with each other and connected to a source of the PMOS transistor M15; the PMOS transistor M15 has a gate and a drain which are connected with each other and connected to a drain of the NMOS transistor M16; and a source of the NMOS transistor M16 is connected to the source of the NMOS transistor M12.

Therefore, when the output voltages TX_DRVP and TX_DRVN are pulled down to a negative voltage, since the NMOS transistors M2 and M12 are turned on, the source voltages and the drain voltages of the NMOS transistors M2 and M12 are equal, and then, the source voltages of the NMOS transistors M2 and M12 are also negative voltages. When the absolute values of the negative voltages are less than the threshold voltages of the NMOS transistors M6 and M16, the NMOS transistors M6 and M16 are turned on. Furthermore, the PMOS transistors M4 and M5 and the PMOS transistors M14 and M15, which are all subjected to the diode connection method in which the gate and the drain are interconnected, are equivalent to active loads, such that the voltages between the gates and the sources of the NMOS transistors M2 and M12 can be clamped, and the voltages between the gates and the drains of the NMOS transistors M2 and M12 are also clamped. Accordingly, the voltages between the gates and the drains of the NMOS transistors M1 and M11 are clamped. In this way, the NMOS transistors M1 and M11 and the NMOS transistors M2 and M12 are prevented from being broken down by the overvoltage between the gates and the drains, when the common-mode transient interference signal occurs.

Therefore, in summary, the present invention provides a common-mode transient suppression protection circuit for a digital isolator, where a linear voltage regulator structure 23 having a power supply clamp VDD Clamp and a drive circuit 22 having a clamping module are arranged in the protection circuit, such that low-voltage devices in the drive circuit 22 can be protected from being damaged by high-voltage signals generated by common-mode transient interference.

Further, the linear voltage regulator structure 23 includes the linear voltage regulator LDO, the voltage regulation follower LDO follower and the power supply clamps VDD Clamp. Moreover, each output voltage TX_VDD is complementarily equipped with one power supply clamp VDD Clamp and one voltage regulation follower LDO follower, and a plurality of output voltages TX_VDD may share one linear voltage regulator LDO.

In addition, the PMOS transistors M9 and M19 are MOS transistors with strong drive capability, such that when the drive circuit 22 is turned on, the NMOS transistors M1 and M11 and the NMOS transistor M2 and M12 can be driven; and the PMOS transistors M7 and M17 are MOS transistors with weak drive capability, such that when a common-mode transient interference signal occurs, the voltage TX_DBP and the voltage TX_DBN are easy to pull down.

Finally, the clamping module includes the PMOS transistor M4, PMOS transistor M5 and NMOS transistor M6, as well as the PMOS transistor M14, PMOS transistor M15 and NMOS transistor M16, all of which are symmetrically arranged. The clamping module is provided such that the NMOS transistors M1 and M11 and the NMOS transistors M2 and M12 can be prevented from being broken down between the gate and the drain.

In addition, it should be understood that although the Description is described according to the embodiments, it is not the case that every embodiment includes only one independent technical solution. Such a presentation manner of the Description is only for clarity. A person skilled in the art should consider the Description as a whole, and the technical solutions in respective embodiments can also be properly combined to form other embodiments that can be understood by a person skilled in the art.

The series of detailed description listed above are merely for specifically illustrating the possible embodiments of the present invention, but are not intended to limit the protection scope of the present invention. Any equivalent embodiments or variations made without departing from the technical spirit of the present invention shall be included within the protection scope of the present invention.

What is claimed is:

1. A common-mode transient suppression protection circuit for a digital isolator, comprising a modulation circuit, a demodulation circuit, and an isolation capacitor connected between the modulation circuit and the demodulation circuit,
wherein the modulation circuit comprises a modulation circuit front-end and a drive circuit, which are connected in sequence, a clamping module being arranged in the drive circuit; and the protection circuit further comprises a linear voltage regulator structure connected to the drive circuit, a power supply clamp being arranged in the linear voltage regulator structure, and
wherein the linear voltage regulator structure further comprises a linear voltage regulator and a voltage regulation follower, the linear voltage regulator is connected to a reference voltage, the voltage regulation follower and the power supply clamp are both connected to the linear voltage regulator, and the power supply clamp is connected to the drive circuit and provides an output voltage TX_VDD.

2. The protection circuit according to claim 1, wherein the linear voltage regulator comprises an amplifier, an NMOS transistor MD1, a PMOS transistor MD3, a resistor RD1 and a resistor RD2, wherein a positive input terminal of the amplifier is connected to the reference voltage, an output terminal of the amplifier is connected to a gate of the NMOS transistor MD1, and a drain of the NMOS transistor MD1 is connected to an external power supply; a negative input terminal of the amplifier is grounded via the resistor RD2, and is connected to a source of the PMOS transistor MD3 via the resistor RD1; and a gate and a drain of the PMOS transistor MD3 are connected, and a source of the NMOS transistor MD1 is also connected to the source of the PMOS transistor MD3.

3. The protection circuit according to claim 2, wherein the voltage regulation follower comprises an NMOS transistor MD2, which has a drain connected to the external power supply, a gate connected to the output terminal of the amplifier, and a source connected to the power supply clamp and the output voltage TX_VDD.

4. The protection circuit according to claim 3, wherein the power supply clamp comprises a PMOS transistor MD4, an NMOS transistor MD6 and an NMOS transistor MD7, wherein a gate of the PMOS transistor MD4 and a gate of the PMOS transistor MD3 are connected to each other, and a source of the PMOS transistor MD4 is connected to the output voltage TX_VDD and the source of the NMOS transistor MD2; and a gate of the NMOS transistor MD6 and a gate of the NMOS transistor MD7 are connected to each other and form a current mirror, a drain and a gate of the NMOS transistor MD6 are connected to each other and connected to a drain of the PMOS transistor MD4, and a source of the NMOS transistor MD6 and a source of the NMOS transistor MD7 are grounded.

5. The protection circuit according to claim 1, wherein at least one output voltage TX_VDD is provided, and each output voltage TX_VDD is complementarily equipped with one power supply clamp and one voltage regulation follower; and when at least two output voltages TX_VDD are provided, the at least two output voltages TX_VDD can share one linear voltage regulator.

6. The protection circuit according to claim 1, wherein the drive circuit further comprises a drive module electrically connected to the modulation circuit front-end and the linear voltage regulator, and a functional module electrically connected to the drive module, the clamping module being electrically connected to the functional module.

7. The protection circuit according to claim 6, wherein two drive modules, two functional modules, and two clamping modules are respectively provided and symmetrically arranged.

8. The protection circuit according to claim 7, wherein the functional module comprises a PMOS transistor M9 and a PMOS transistor M19, which are symmetrically arranged and are strong in drive capability, a gate of the PMOS transistor M9 and a gate of the PMOS transistor M19 being connected to the two drive modules, respectively, and the PMOS transistor M9 and the PMOS transistor M19 each having a drain grounded and a source connected to the output voltage TX_VDD; and the drive module further comprises a PMOS transistor M7 and a PMOS transistor M17, which are symmetrically arranged and are weak in drive capability, the PMOS transistor M7 and the PMOS transistor M17 having gates also connected to the two drive modules respectively, and having sources connected to the output voltage TX_VDD.

9. The protection circuit according to claim 8, wherein the functional module further comprises a PMOS transistor M1 and a PMOS transistor M11, which are symmetrically arranged, wherein the PMOS transistor M1 and the PMOS transistor M11 have sources both connected to the output voltage TX_VDD, having gates connected to the drain of the PMOS transistor M7 and the drain of the PMOS transistor M17 respectively, and having drains connected to output voltages TX_DRVP and TX_DRVN respectively, and the output voltages TX_DRVP and TX_DRVN are both connected to the isolation capacitor; and
wherein the functional module further comprises an NMOS transistor M2 and an NMOS transistor M12, which are symmetrically arranged, wherein the NMOS transistor M2 and the NMOS transistor M12 have drains connected to the drain of the PMOS transistor M1 and the drain of the PMOS transistor M11 respectively, and have gates connected to the gate of the PMOS transistor M1 and the gate of the PMOS transistor M11 respectively, and the gates and sources of the NMOS transistor M2 and the NMOS transistor M12 are connected to two embedded modules respectively.

10. The protection circuit according to claim 9, wherein the clamping module comprises a PMOS transistor M4, a PMOS transistor M5 and an NMOS transistor M6, as well as a PMOS transistor M14, a PMOS transistor M15, and an NMOS transistor M16, which are all symmetrically arranged, wherein the PMOS transistor M4 has a source connected to the gate of the NMOS transistor M2, and has a drain and a gate which are connected with each other and connected to a source of the PMOS transistor M5, the PMOS transistor M5 has a gate and a drain which are connected with each other and connected to a drain of the NMOS transistor M6, and a source of the NMOS transistor M6 is connected to the source of the NMOS transistor M2; and the PMOS transistor M14 has a source connected to the gate of the NMOS transistor M12, and has a drain and a gate which are connected with each other and connected to a source of the PMOS transistor M15, the PMOS transistor M15 has a gate and a drain which are connected with each other and connected to a drain of the NMOS transistor M16, and a source of the NMOS transistor M16 is connected to the source of the NMOS transistor M12.

* * * * *